United States Patent
Ishibashi

(10) Patent No.: US 12,342,482 B2
(45) Date of Patent: Jun. 24, 2025

(54) ELECTRONIC DEVICE

(71) Applicant: KYOCERA Corporation, Kyoto (JP)

(72) Inventor: Kenji Ishibashi, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/612,906

(22) Filed: Mar. 21, 2024

(65) Prior Publication Data

US 2024/0334628 A1  Oct. 3, 2024

(30) Foreign Application Priority Data

Mar. 27, 2023 (JP) ................. 2023-050143

(51) Int. Cl.
*H05K 5/02* (2006.01)
*H04B 1/3888* (2015.01)
*H04R 1/02* (2006.01)

(52) U.S. Cl.
CPC ......... *H05K 5/0217* (2013.01); *H04B 1/3888* (2013.01); *H04R 1/023* (2013.01); *H04R 1/028* (2013.01); *H04R 2499/11* (2013.01); *H04R 2499/15* (2013.01)

(58) Field of Classification Search
CPC .. H04R 2499/11; H04R 1/023; H05K 5/0217; H04B 2001/03894
See application file for complete search history.

(56) References Cited

U.S. PATENT DOCUMENTS

| | | | |
|---|---|---|---|
| 2016/0316285 A1* | 10/2016 | Qian | H04R 1/086 |
| 2016/0378142 A1* | 12/2016 | Cardinali | H04R 1/00 361/679.56 |
| 2017/0245036 A1* | 8/2017 | Kuki | C08J 5/18 |
| 2018/0035203 A1* | 2/2018 | Hirai | H05K 5/06 |
| 2018/0228043 A1 | 8/2018 | Michiwaki | |
| 2021/0152903 A1* | 5/2021 | Mietta | H04R 1/025 |
| 2023/0083314 A1* | 3/2023 | Liang | H04R 1/028 381/334 |
| 2023/0247336 A1* | 8/2023 | Liang | H05K 5/0214 361/679.01 |

FOREIGN PATENT DOCUMENTS

| | | | |
|---|---|---|---|
| JP | 2011188191 A | * | 9/2011 |
| JP | 2018-128583 A | | 8/2018 |

* cited by examiner

*Primary Examiner* — Wen W Huang
(74) *Attorney, Agent, or Firm* — Studebaker Brackett PLLC

(57) ABSTRACT

An electronic device includes: a housing including a mesh configured to communicate between an external space of the housing and an internal space of the housing; and a protecter overlapping part of the mesh in plan view of the mesh. The protecter includes a first portion extending alongside the mesh without being in contact with the mesh and a second portion protruding toward the mesh and being in contact with the mesh at a distal end of the second portion.

9 Claims, 6 Drawing Sheets

ELECTRONIC DEVICE

CROSS REFERENCES TO RELATED APPLICATIONS

The present invention contains subject matter related to Japanese Patent Application No. 2023-50143 filed in the Japan Patent Office on Mar. 27, 2023, the entire contents of which are incorporated herein by reference.

BACKGROUND OF THE INVENTION

1. Field of the Invention

The present disclosure relates to an electronic device.

2. Description of the Related Art

An electronic device including a front panel configured to be detachable from the housing is known (for example, see Japanese Unexamined Patent Application Publication No. 2018-128583).

SUMMARY OF THE INVENTION

An electronic device according to an embodiment of the present disclosure includes: a housing including a mesh configured to communicate between an external space of the housing and an internal space of the housing; and a protecter overlapping part of the mesh in plan view of the mesh. The protecter includes a first portion extending alongside the mesh without being in contact with the mesh and a second portion protruding toward the mesh and being in contact with the mesh at a distal end of the second portion.

DESCRIPTION OF THE PREFERRED EMBODIMENTS

When water enters an electronic device, the water can be removed by removing a front panel. However, a configuration that enables a cover such as the front panel to be removed imposes restriction on the design of the electronic device. The present disclosure provides an electronic device that enables water to be easily removed without a cover having to be removed.

An electronic device according to the present embodiment may be a portable electronic device such as a mobile phone or a smartphone. The electronic device according to the present embodiment is not limited to portable electronic devices. The electronic device may be various kinds of electronic devices such as a desktop personal computer (PC), a laptop PC, a tablet PC, a home appliance, industrial equipment or factory automation (FA) equipment, or a dedicated terminal.

Figure 1:
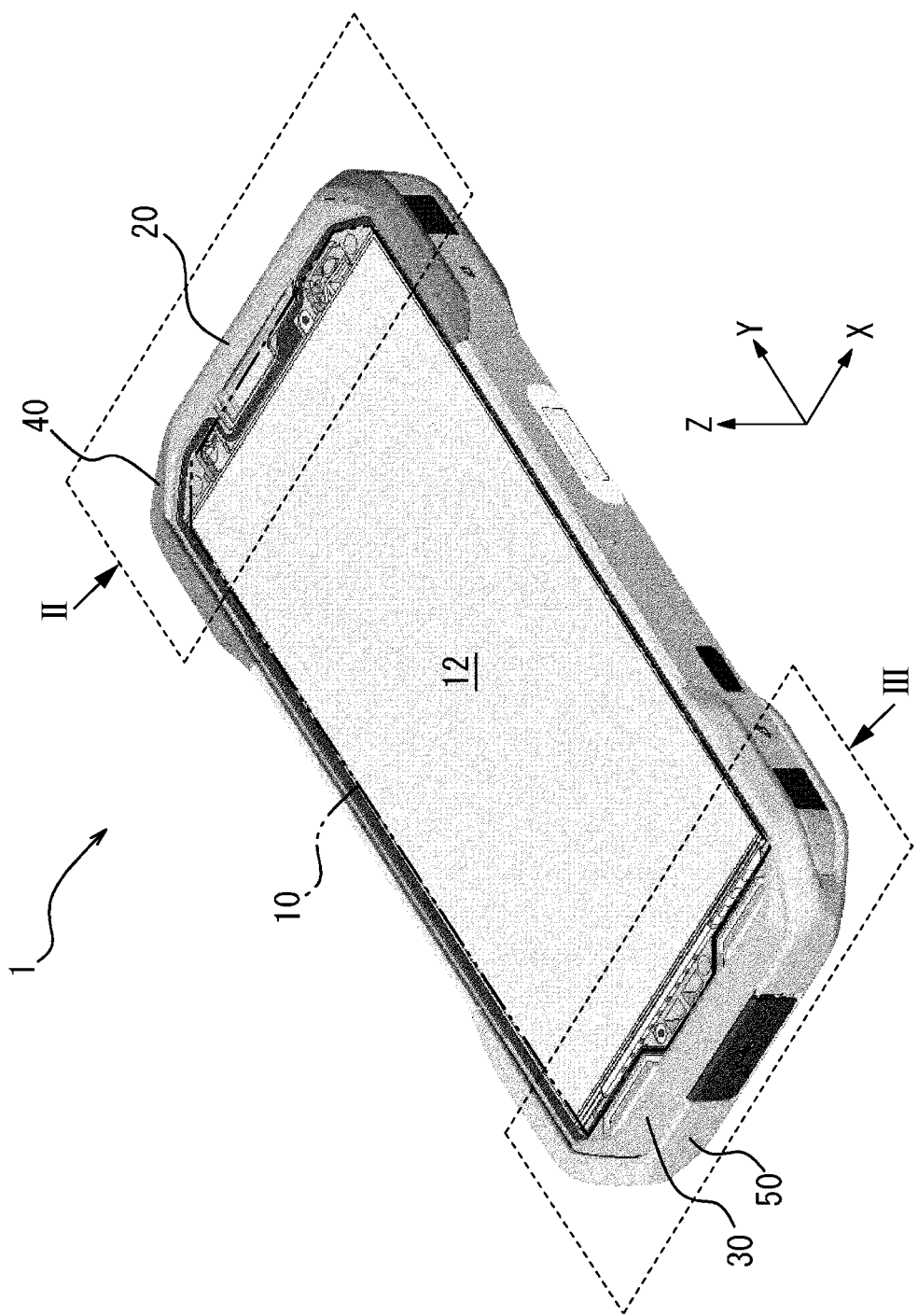
FIG. 1 is a perspective view of an electronic device according to an embodiment, illustrating an example.

As illustrated in FIG. 1, an electronic device 1 according to an embodiment includes a housing 10 and a display 12. The housing 10 holds the display 12. The display 12 may be a display device such as a liquid crystal display, an organic electroluminescence (EL) display, or an inorganic EL display, for example, but is not limited to such examples. The display 12 may be a touch panel equipped with a touch sensor. The electronic device 1 further includes a speaker 14 (see FIG. 4 or 5).

In the present embodiment, it is assumed that the shape of the housing 10 is an approximately rectangular parallelepiped. The housing 10 includes a first surface on which the display 12 is located and a second surface opposed to the front surface. The first surface is assumed to face the positive Z-axis direction. The first surface is also referred to as the front surface. The second surface is assumed to face the negative Z-axis direction. The second surface is also referred to as the back surface. Each surface of the housing 10 is not limited to a flat surface and may be a curved surface including a bent shape. The surfaces of the housing 10 may be connected to one another so as to intersect each other. The surfaces of the housing 10 may be connected to one another smoothly. The shape of the housing 10 is not limited to an approximately rectangular parallelepiped and may be other various shapes.

The electronic device 1 includes an upper end cover 20 located at an end portion in the positive Y-axis direction and a lower end cover 30 located at an end portion in the negative Y-axis direction. The upper end cover 20 and the lower end cover 30 are also collectively referred to as end covers. The electronic device 1 includes a shock absorption member 40 located at an end portion in the positive Y-axis direction and a shock absorption member 50 located at an end portion in the negative Y-axis direction.

Figure 2:
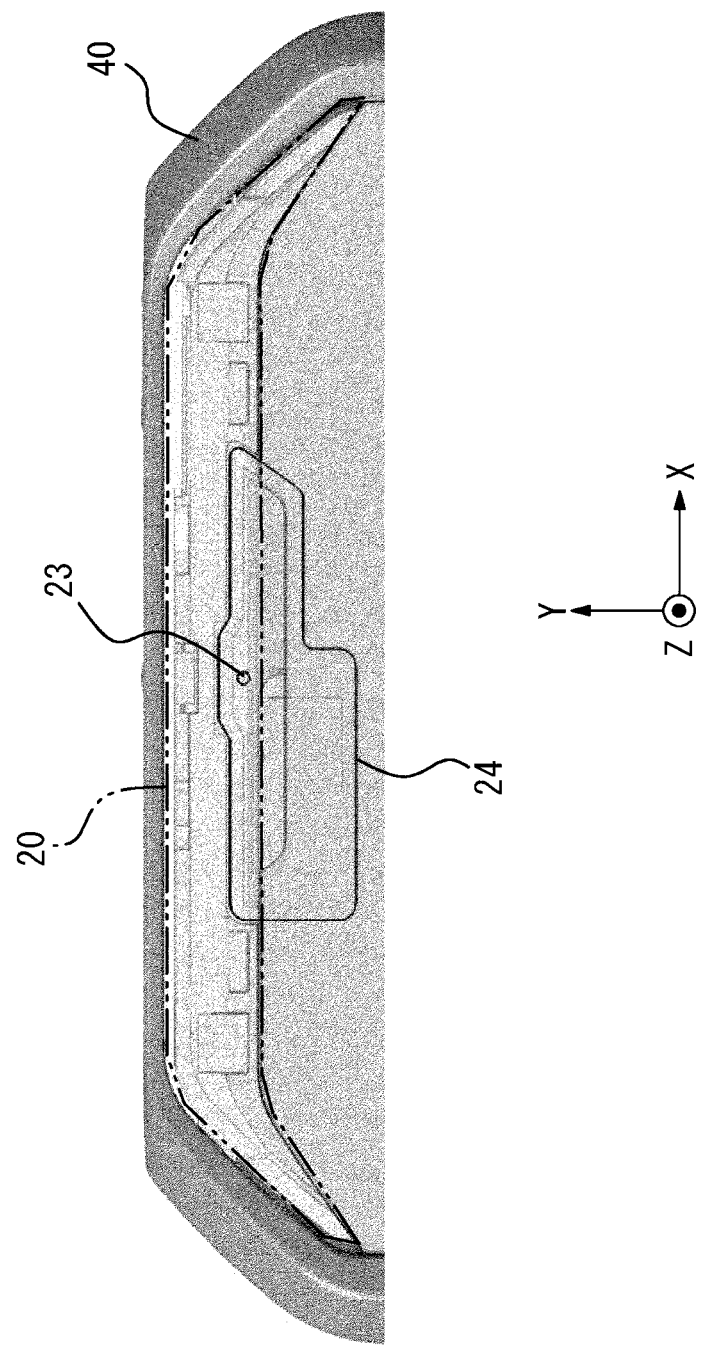
FIG. 2 is a plan view of the portion in rectangle II in FIG. 1.

As illustrated in FIG. 2, the electronic device 1 includes a mesh 24 at an end portion in the positive Y-axis direction. When the speaker 14 is located inside the housing 10, the meshes 24, 35, and 36 enable the internal space of the housing 10, where the speaker 14 is located, to communicate with the external space of the housing 10 so that sound generated by the speaker 14 can propagate to the outside of the housing 10. The mesh 24 may have, for example, a mesh shape or a plurality of holes.

Part of the mesh 24 is covered with the upper end cover 20 in plan view of the first surface of the housing 10. In other words, the upper end cover 20 overlaps part of the mesh 24 in plan view of the mesh 24.

Figure 3:
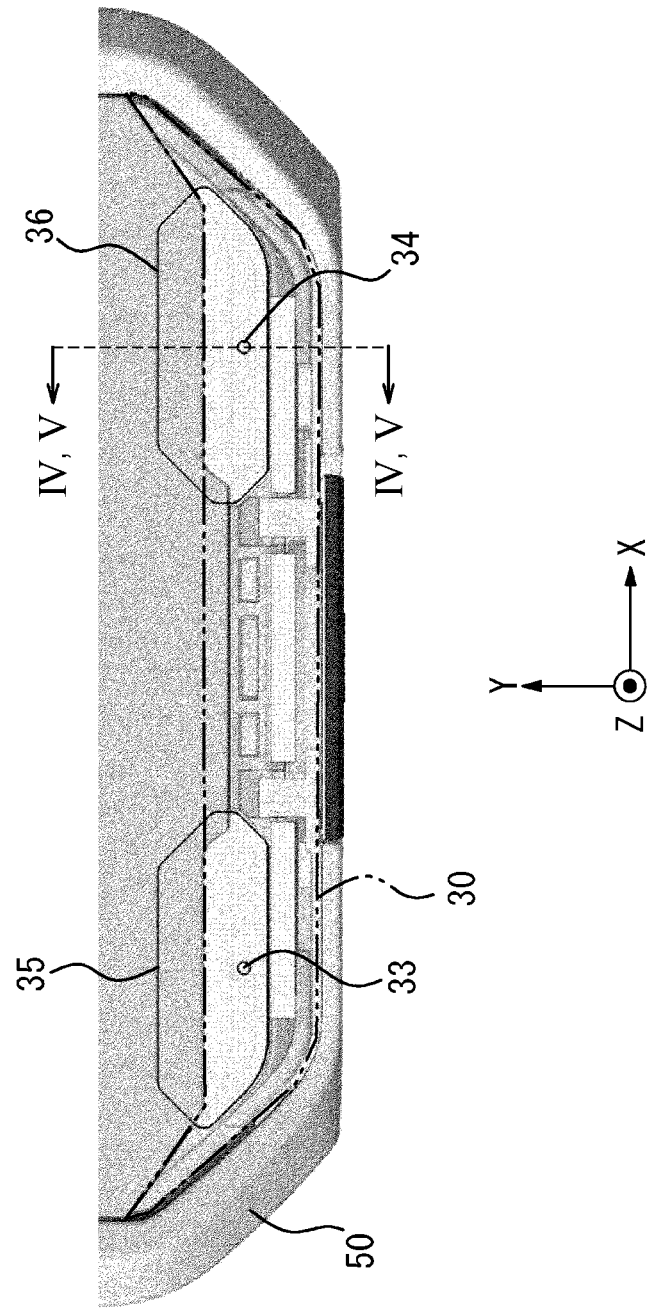
FIG. 3 is a plan view of the portion in rectangle III in FIG. 1.

As illustrated in FIG. 3, the electronic device 1 includes the meshes 35 and 36 at end portions in the negative Y-axis direction. Part of the mesh 35 and part of the mesh 36 are covered with the lower end cover 30 in plan view of the first surface of the housing 10. In other words, the lower end cover 30 overlaps part of the mesh 35 and part of the mesh 36 in plan view of the meshes 35 and 36.

The upper end cover 20 includes a portion extending alongside the mesh 24 without being in contact with the mesh 24 and a protrusion portion 23 in contact with the mesh 24. The lower end cover 30 includes a portion extending alongside the meshes 35 and 36 without being in contact with the meshes 35 and 36, a protrusion portion 33 in contact with the mesh 35, and a protrusion portion 34 in contact with the mesh 36. The portion of the upper end cover 20 extending alongside the mesh 24 without being in contact with the mesh 24 and the portion of the lower end cover 30 extending alongside the meshes 35 and 36 without being in contact with the meshes 35 and 36 are also referred to as first portions. The portion of the upper end cover 20 in contact with the mesh 24, the portion of the lower end cover 30 in contact with the mesh 35, and the portion of the lower end cover 30 in contact with the mesh 36 are also referred to as second portions.

The upper end cover 20 and the lower end cover 30 are also referred to as protecters for the meshes 24, 35, and 36. Each protecter has a first portion and a second portion. The first portion extends alongside the mesh without being in contact with the mesh. The second portion protrudes from the protection portion toward the mesh and is in contact with the mesh at its distal end.

Figure 4:
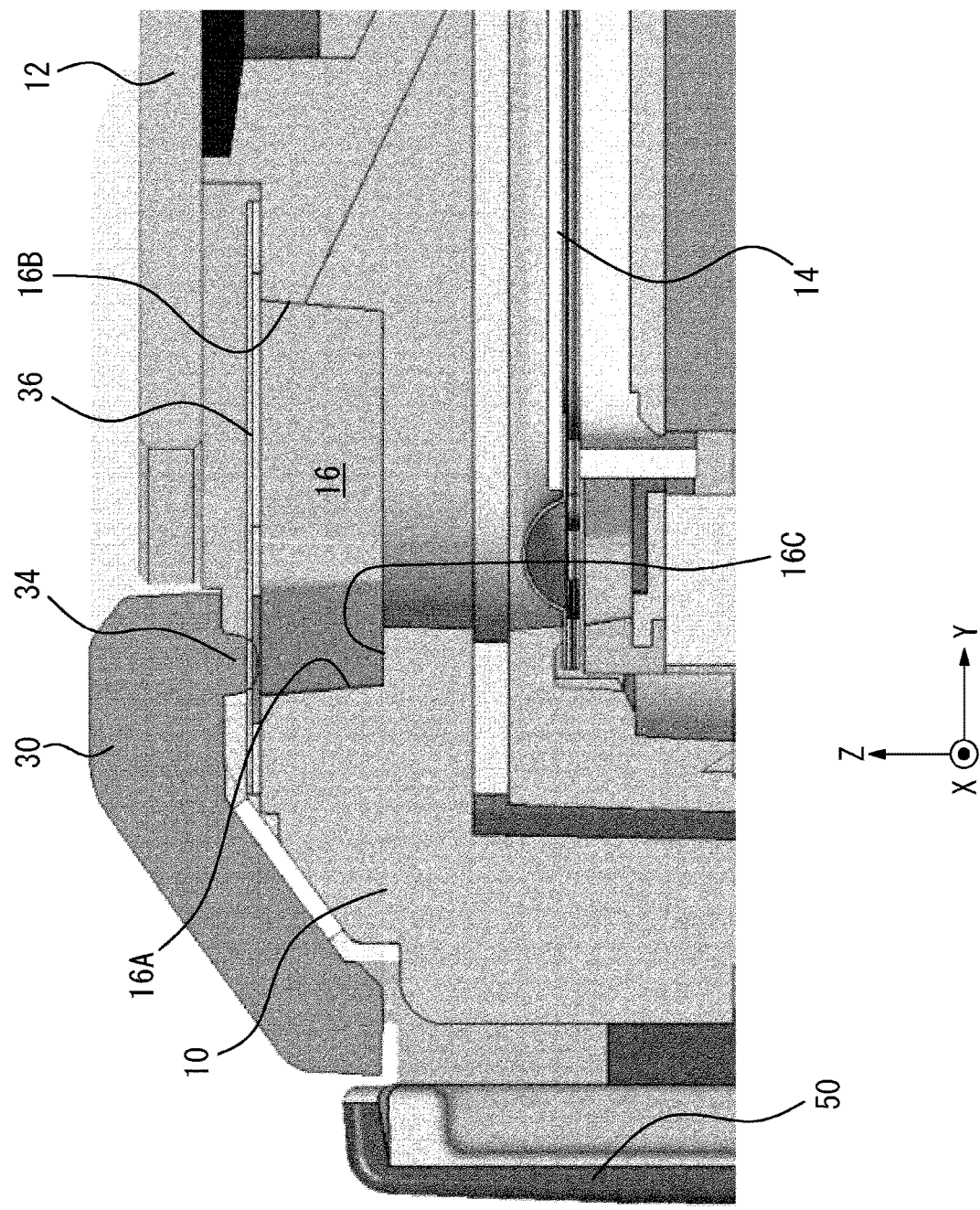
FIG. 4 is a cross-sectional view taken along line IV-IV in FIG. 3.
Figure 5:
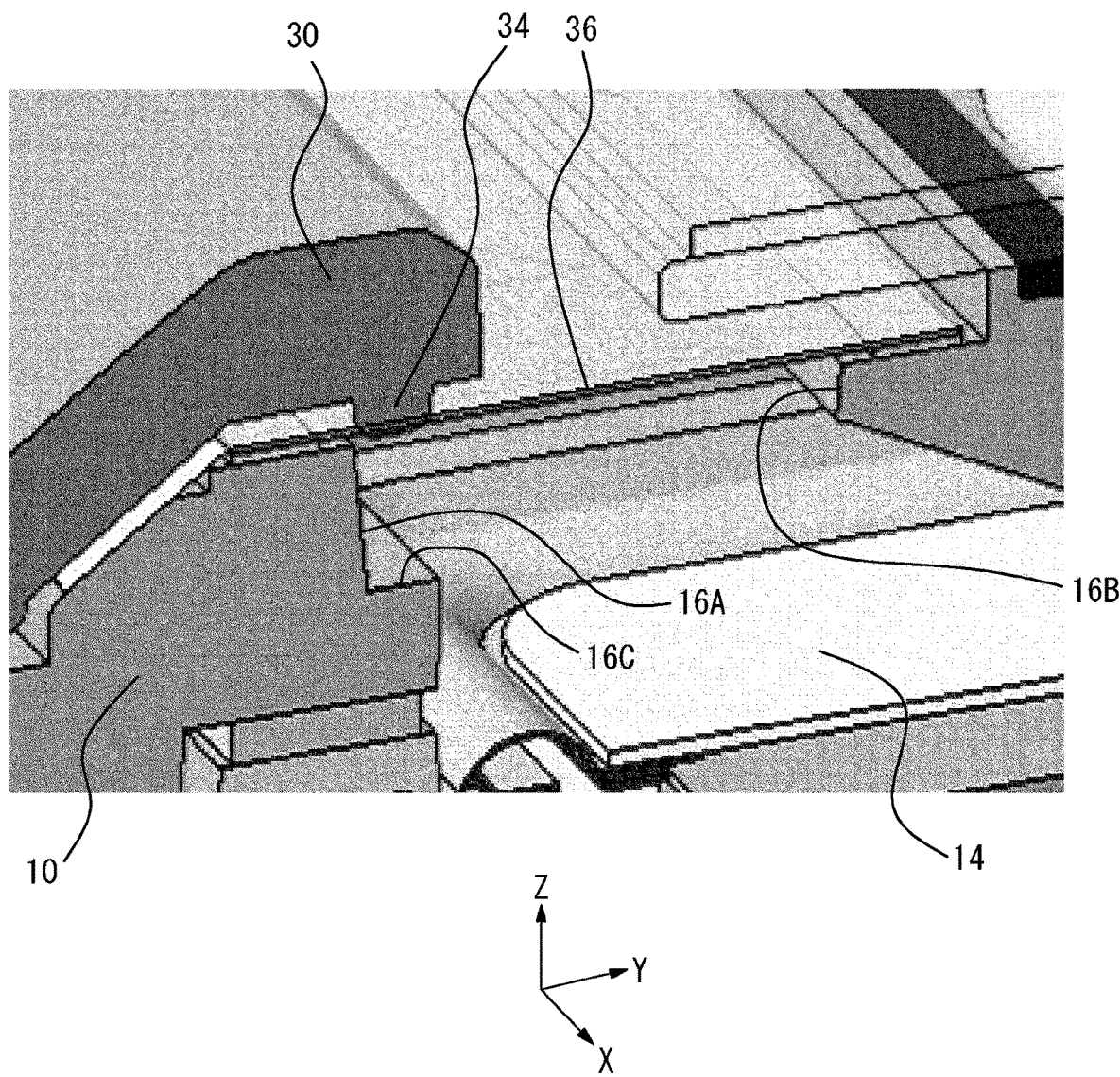
FIG. 5 is a perspective view of the cross section taken along line V-V in FIG. 3.

As illustrated in FIGS. 4 and 5, the housing 10 includes walls 16A and 16B and a bottom 16C forming a space inside the mesh 36. The space formed by the walls 16A and 16B and the bottom 16C is used to collect the water that has entered the housing 10 as described later and is also referred to as a water storage 16. The mesh 36 is located at a position where it covers the water storage 16. The water storage 16 formed by the walls 16A and 16B and the bottom 16C is located on the side of the mesh 36 opposite to the lower end cover 30.

The water storage 16 is located between the speaker 14 in the housing 10 and the space extending outside the mesh 36. The lower end cover 30 is located outside the housing 10 relative to the mesh 36. The lower end cover 30 includes the protrusion portion 34 protruding toward the mesh 36. The protrusion portion 34 has a distal end in contact with the mesh 36. The protrusion portion 34 may be pressed against the mesh 36.

Here, in the electronic device 1, the mesh 36, which separates the space extending outside the housing 10 and the space extending inside the housing 10, makes it difficult for water to enter the housing 10. However, when water at high pressure comes into contact with the mesh 36, there is an increased chance of water passing through the mesh 36. Water passing through the mesh 36 enters the housing 10 and is not easily discharged to the outside due to the mesh 36.

Figure 6A:
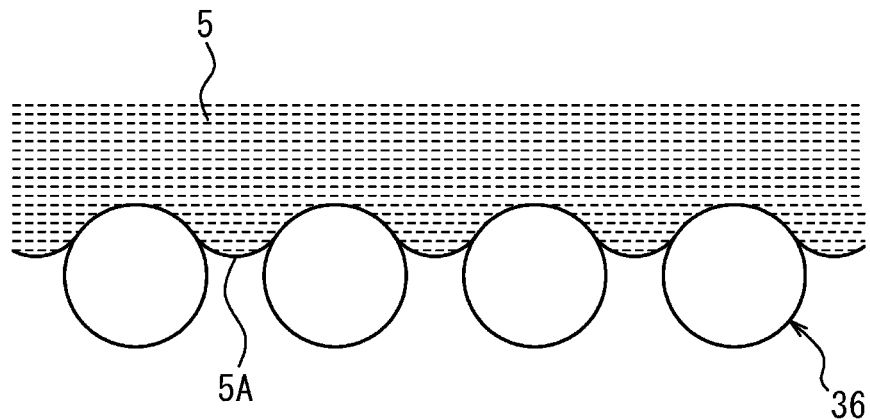
FIG. 6A is a diagram illustrating water that cannot pass through a mesh due to menisci of the water forming when the water comes in contact with the mesh.

Specifically, as illustrated in FIG. 6A as an example, when intruding water 5 comes into contact with the mesh 36, curved meniscus surfaces 5A are formed in the gaps in the mesh 36, and as a result, the intruding water 5 has a decreased chance of passing through the mesh 36. In this case, the gaps in the mesh of the mesh 36 are smaller than or equal to the maximum gaps that cause menisci of the intruding water 5 to form.

Figure 6B:
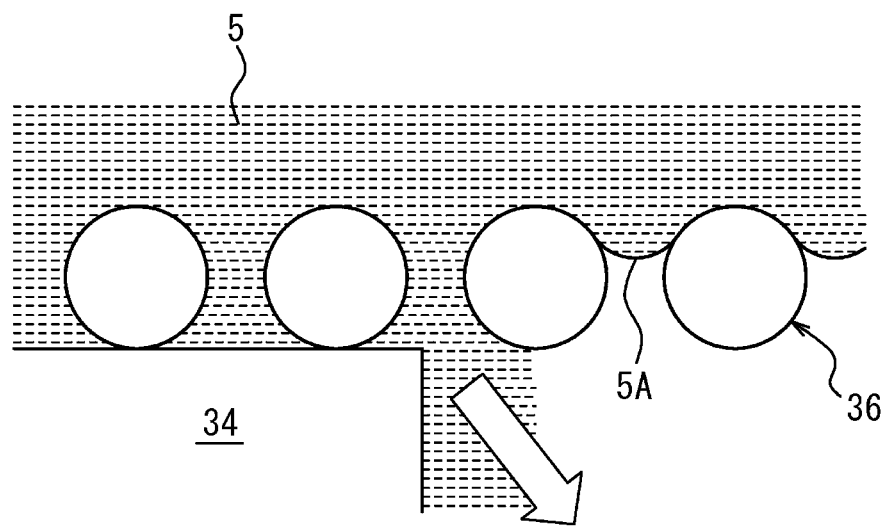
FIG. 6B is a diagram illustrating water passing through a mesh because a meniscus is broken due to a boss being in contact with the mesh.

In the electronic device 1 according to the present embodiment, the protrusion portion 34 is in contact with the mesh 36 as illustrated in FIG. 6B as an example. Since the protrusion portion 34 is in contact with the mesh 36, menisci occur between the mesh 36 and the protrusion portion 34. The occurrence of menisci between the mesh 36 and the protrusion portion 34 breaks curved meniscus surfaces 5A formed between the gaps in the mesh 36. This makes it easier for the intruding water 5 to pass through the mesh 36. For example, the intruding water 5 can be discharged to the outside of the housing 10 just by shaking the electronic device 1 lightly.

Since the protrusion portion 34 is in contact with the mesh 36 from the outside of the housing 10, water outside the housing 10 tends to stay on the protrusion portion 34 side. Hence, at the portion where the protrusion portion 34 is in contact with the mesh 36 from the outside, water can easily pass through the mesh 36 from the inside to the outside, but water cannot easily pass through from the outside to the inside.

The mesh 36 may be subjected to a water-repellent treatment by using a waterproof material such as a fluorine-based resin or a silicone-based resin. The mesh 36 may be made of a waterproof synthetic fiber such as a fluorine-based resin or a silicone-based resin. When the mesh 36 is subjected to a water-repellent treatment or the mesh 36 is made of a waterproof synthetic fiber, water outside the housing 10 is more likely to stay on the protrusion portion 34 side. On the other hand, at the portion where the protrusion portion 34 is in contact with the mesh 36 from the outside, water can easily pass through the mesh 36 from the inside to the outside.

When water enters the housing 10, the water is collected into the water storage 16 which the mesh 36 faces to efficiently discharge the water from the mesh 36. To efficiently discharge the water collected into the water storage 16 to the outside of the housing 10, the protrusion portion 34 may be in contact with a portion of the mesh 36, the portion facing the water storage 16.

The water collected at positions close to the mesh 36 is efficiently discharged. For example, the water collected at the portion formed by the bottom 16C is closer to the mesh 36 than the water collected at the portion communicating with the space of the speaker 14 where the bottom 16C is not present. The protrusion portion 34 may be in contact with a portion of the mesh 36, the portion facing the bottom 16C. Such a configuration enables water to be efficiently discharged to the outside of the housing 10.

The protrusion portion 34 may be a boss or a rib. The protrusion portion 34 may include a plurality of bosses. The protrusion portion 34 may be located such that the outline of the surface of the protrusion portion 34 in contact with the mesh 36 is long. Only a part of the protrusion portion 34 has to be in contact with the mesh 36. In other words, only a part of the second portion of the protecter has to be in contact with the mesh.

The portion of the lower end cover 30 extending alongside the mesh 36 may overlap the mesh 36 in an area smaller than half the area of the portion of the mesh 36 facing the water storage 16. In other words, in plan view of the mesh 36, the first portion of the protecter may overlap the mesh 36 in an area smaller than half the area of the portion of the mesh 36 facing the water storage 16. Since the area of the first portion of the protecter overlapping the mesh 36 is small, sound generated by the speaker 14 is less likely to be blocked by the protecter.

(Summary)

As described above, in the electronic device 1 according to the embodiment of the present disclosure, the protrusion portion is in contact from the outside of the housing 10 with the portion of the mesh facing the water storage. This configuration enables the water that has entered the mesh to be easily discharged to the outside of the housing 10.

In a device according to a comparative example, nothing is in contact with a portion of the mesh, the portion facing the internal space. In the device according to the comparative example, menisci occur at the mesh, and water is not easily discharged just by shaking the device. Accordingly, the cover needs to be removed so that the water that has entered can be wiped off.

However, with the present disclosure, water can be discharged through the mesh just by shaking the electronic device 1 lightly. In other words, the present disclosure provides an electronic device 1 that enables water to be discharged without removing the cover.

In the electronic device 1 according to the embodiment of the present disclosure, the second portion of the protecter is not in contact with the mesh over a large area; rather, only part of the second portion is in contact. This configuration makes it less likely for the protecter to hinder water from being discharged and results in efficient discharge of water.

Although the embodiment according to the present disclosure has been described in accordance with the drawings and the example, it should be noted that various changes and modifications in the present disclosure can be made by those skilled in the art. Hence, it should be noted that such changes and modifications will be included in the scope of the present disclosure. For example, the functions and the like included in each component or the like can be modified unless doing so causes logical contradictions. In addition, two or more components can be combined, or a component can be divided.

The terms "first", "second", and the like in the present disclosure are identifiers to distinguish the components. For the components distinguished by being prefixed with "first", "second", and the like in the present disclosure, the ordinal numbers of the components can be replaced with each other. For example, for the first surface and the second surface, "first" and "second", which are identifiers, can be replaced with each other. Replacement of identifiers is performed at the same time. Also after replacement of identifiers, the components are distinguished. Identifiers may also be eliminated. The components from which identifiers are eliminated are distinguished with symbols. Identifiers such as "first" and "second" when used alone in the present disclosure cannot be used for interpretation of the order of components or as a basis for the existence of an identifier with a smaller number.

In an embodiment, (1) an electronic device includes: a housing including a mesh configured to communicate between an external space of the housing and an internal space of the housing; and a protecter overlapping part of the mesh in plan view of the mesh. The protecter includes a first portion extending alongside the mesh without being in contact with the mesh and a second portion protruding toward the mesh and being in contact with the mesh at a distal end of the second portion.

(2) In the electronic device according to (1) above, the housing may include a water storage configured to water, the water storage being opposite to the protecter from the mesh. The first portion may overlap the mesh in an area smaller than half an area of a part of the mesh, the part facing the water storage, in plan view of the mesh. At least part of the second portion may be in contact with the part of the mesh facing the water storage.

(3) In the electronic device according to (2) above, the housing may comprise a speaker inside. The water storage may include a bottom. At least part of the second portion may be in contact with a part of the mesh, the part facing the bottom.

(4) In the electronic device according to any one of (1) to (3) above, gaps in the mesh may be smaller than or equal to maximum gaps that cause menisci of water to form.

(5) In the electronic device according to any one of (1) to (4) above, the second portion may be a boss or a rib.

(6) In the electronic device according to any one of (2) to (5) above, the water storage may include a wall forming the water storage.

(7) In the electronic device according to any one of (3) to (6) above, the water storage may include a portion through which the speaker and the mesh communicate with each other.

(8) In the electronic device according to any one of (1) to (7) above, the mesh may include a mesh shape.

(9) In the electronic device according to any one of (1) to (7) above, the mesh may include a plurality of holes.

What is claimed is:

1. An electronic device comprising:
    a housing comprising:
        a mesh located between an external space of the housing and an internal space of the housing, and comprising:
            a first area fixed to the housing; and
            a second area other than the first area, free from the housing; and
        a water storage defined as a part of the internal space, configured to hold water, and being in contact with the second area and in no contact with the first area; and
    a protecter overlapping a part of the mesh in a plan view of the mesh, wherein
    the protecter comprises:
        a first portion extending alongside the mesh without being in contact with the first area of the mesh; and
        a second portion comprising a protrusion protruding toward the mesh, a tip of the protrusion being in contact with the second area of the mesh.

2. The electronic device according to claim 1, wherein
    the water storage is opposite to the protecter from the mesh,
    the first portion overlaps the mesh in an area smaller than half an area of a part of the mesh, the part facing the water storage, in plan view of the mesh, and
    the tip of the protrusion of the second portion is in contact with the part of the mesh facing the water storage.

3. The electronic device according to claim 2, wherein
    the housing further comprises a speaker inside,
    the water storage comprises a bottom, and
    the protrusion of the second portion is in contact with a part of the mesh, the part facing the bottom.

4. The electronic device according to claim 3, wherein the water storage further comprises a portion through which the speaker and the mesh communicate with each other.

5. The electronic device according to claim 2, wherein the water storage comprises a wall forming the water storage.

6. The electronic device according to claim 1, wherein gaps in the mesh are smaller than or equal to maximum gaps that cause menisci of water to form.

7. The electronic device according to claim 1, wherein the protrusion of the second portion is a boss or a rib.

8. The electronic device according to claim 1, wherein the mesh comprising a mesh shape.

9. The electronic device according to claim 1, wherein the mesh comprising a plurality of holes.

* * * * *